United States Patent [19]
Fujita et al.

[11] Patent Number: 5,463,251
[45] Date of Patent: Oct. 31, 1995

[54] POWER SEMICONDUCTOR PACKAGE HAVING IMPROVED DURABILITY

[75] Inventors: Akira Fujita; Naoki Yoshimatsu, both of Fukuoka, Japan

[73] Assignee: Mitsubishi Denki Kabushiki Kaisha, Tokyo, Japan

[21] Appl. No.: 47,465

[22] Filed: Apr. 19, 1993

[30] Foreign Application Priority Data

Jul. 8, 1992 [JP] Japan .................................. 4-180982

[51] Int. Cl.⁶ ............................................. H01L 23/02
[52] U.S. Cl. ......................... 257/717; 257/706; 361/719
[58] Field of Search .......................... 257/687, 706, 257/718, 720, 723, 727, 728, 668, 723, 777; 361/719

[56] References Cited

U.S. PATENT DOCUMENTS

| | | | |
|---|---|---|---|
| 4,204,248 | 5/1980 | Proffit et al. | 361/707 |
| 4,514,587 | 4/1985 | Van Dyk Soerewyn | 257/687 |
| 4,695,872 | 9/1987 | Chatterjee | 257/777 |
| 4,855,809 | 8/1989 | Malhi et al. | 257/777 |
| 4,956,695 | 9/1990 | Robinson et al. | 257/686 |
| 5,025,306 | 6/1991 | Johnson et al. | 257/727 |
| 5,170,325 | 12/1992 | Bentz et al. | 361/707 |
| 5,173,766 | 12/1992 | Long et al. | 257/687 |
| 5,239,199 | 8/1993 | Chiu | 257/723 |

FOREIGN PATENT DOCUMENTS

| | | |
|---|---|---|
| 0531724 | 3/1993 | European Pat. Off. . |
| 3415446 | 10/1984 | Germany . |
| 53-003065 | 1/1978 | Japan .................................. 257/686 |
| 58-52835 | 3/1983 | Japan . |
| 61-218147 | 9/1986 | Japan .................................. 257/717 |
| 62-293749 | 12/1987 | Japan .................................. 257/686 |
| 63-099559 | 4/1988 | Japan .................................. 257/723 |
| 2-56957 | 2/1990 | Japan . |
| 04179263 | 6/1992 | Japan .................................. 257/723 |

OTHER PUBLICATIONS

Patent Abstracts of Japan, vol. 10, No. 263 (E–435), Sep. 9, 1986, JP–A 61–88547, May 6, 1986.

Primary Examiner—Rolf Hille
Assistant Examiner—T. M. Arroyo
Attorney, Agent, or Firm—Oblon, Spivak, McClelland, Maier & Neustadt

[57] ABSTRACT

There is disclosed a semiconductor device wherein a mounting substrate (3) including an insulating layer and a pattern electrode selectively provided on the insulating layer is mounted on a heat sink (6) having a major surface. A plurality of copper supports (2) each having a surface forming an angle of substantially not more than 90° with the major surface of the heat sink (6) are provided on the mounting substrate (3) such that the respective surfaces are not opposed to each other, and each of the supports (2) supports a semiconductor body (1). The semiconductor bodies (1) are connected to the pattern electrode with wires (9), and a portion enclosing at least the wires (9) is filled with a silicone gel (11). This permits the semiconductor device of large capacity to be reduced in size and to have an improved durability.

17 Claims, 16 Drawing Sheets

POWER SEMICONDUCTOR PACKAGE HAVING IMPROVED DURABILITY

BACKGROUND OF THE INVENTION

1. Field of the Invention

The present invention relates to a semiconductor device such as a power semiconductor module and a method of fabricating the same.

2. Description of the Background Art

FIG. 15 is a plan view of a mounted major part of a conventional semiconductor device 200. FIG. 16 is a schematic front elevation of the semiconductor device 200 as viewed in the direction of the arrow A1 of FIG. 15. Referring to FIGS. 15 and 16, the semiconductor device 200 comprises a plurality of semiconductor bodies 1; insulating substrates 3 provided with metal patterns 4a to 4e; a heat sink 6; external electrodes 8; and wires 9.

The conventional semiconductor device 200 is fabricated in a manner to be described hereinafter. The insulating substrates 3 provided with the metal patterns 4a to 4e mounted on the top surface thereof and a metal layer mounted on the bottom surface thereof are placed on the heat sink 6. The semiconductor bodies 1 are placed horizontally on the insulating substrates 3 to be bonded to the insulating substrates 3 with a soldering material (not shown) such as solder. After the semiconductor bodies 1 are mounted, the wires 9 made of, for example, aluminum connect the semiconductor bodies 1 to the metal patterns 4b, 4c, 4d, 4c, whereby the metal patterns 4b, 4c, 4d, 4e serve as electrodes of the semiconductor bodies 1. When the semiconductor bodies 1 are bipolar transistors, the metal patterns 4a, 4b, 4c serve as collector, emitter, base electrodes, respectively, and the metal patterns 4d and 4e serve as relay electrodes. Then the respective external electrodes 8 are joined to the metal pattern electrodes 4a, 4b, 4c. The mount assembly provided in the foregoing manner is subjected to resin seal and the like, so that the semiconductor device 200 is provided.

In the conventional semiconductor device 200, the semiconductor bodies 1 are disposed horizontally. When the semiconductor device 200 is operated, the heat generated by the respective semiconductor bodies 1, if provided in multiplicity as shown in FIG. 15, acts synergistically to exceed the heat sink capability of the semiconductor device 200. The disadvantage of the conventional semiconductor device 200 is that it is thermally broken after prolonged use.

Another disadvantage is the increasing size of the large-capacity semiconductor device having a large number of semiconductor bodies because of the horizontal arrangement of the semiconductor bodies.

SUMMARY OF THE INVENTION

According to the present invention, a semiconductor device comprises: (a) a heat sink having a major surface; (b) a mounting substrate fixed on the heat sink and including (b-1) an insulating layer provided on the major surface of the heat sink, and (b-2) a pattern electrode layer selectively formed on the insulating layer; (c) a metal support formed on the mounting substrate and having a surface forming an angle of substantially not more than 90° with the major surface of the heat sink; and (d) a semiconductor body fixed on the surface of the support to thereby be supported with the support.

In another aspect of the present invention, a semiconductor device comprises: (a) a heat sink having a major surface; (b) a metal block fixed on the heat sink in electrically insulated relation to the heat sink and having a surface forming an angle of substantially not more than 90° with the major surface of the heat sink; and (c) a semiconductor body fixed on the surface of the block to thereby be supported with the block.

In still another aspect of the present invention, a semiconductor device comprises: (a) a heat sink having a major surface; (b) a metal support member including a first plate portion fixed on the heat sink in electrically insulated relation to the heat sink, and a second plate portion extending in a direction that forms an angle of substantially not more than 90° with the major surface of the heat sink from an end of the first plate portion; and (c) a semiconductor body fixed on a surface of the second plate portion to thereby be supported with the support member.

In a further aspect of the present invention, a semiconductor device comprises: (a) a heat sink having a major surface; (b) a mounting substrate fixed on the heat sink and including (b-1) an insulating layer provided on the major surface of the heat sink, and (b-2) a pattern electrode layer selectively formed on the insulating layer; (c) a plurality of metal supports each having a surface forming an angle of substantially not more than 90° with the major surface of the heat sink and mounted on the mounting substrate such that the surfaces of the supports are not opposed to each other; and (d) a plurality of semiconductor bodies fixed on the surfaces of the supports to thereby be supported with the supports, respectively.

The present invention is also intended for a method of fabricating a semiconductor device. According to the present invention, the method comprises the steps of: (a) supporting a semiconductor body having a major surface with a metal support; (b) fixing, on a major surface of a heat sink, a mounting substrate including an insulating layer and a pattern electrode layer selectively formed on the insulating layer; and (c) fixing the support on the mounting substrate such that the major surface of the semiconductor body forms an angle of substantially not more than 90° with the major surface of the heat sink.

According to the present invention, the semiconductor body is supported with the support so as to form the angle of not more than 90° with the heat sink. This permits the semiconductor device to be reduced in size in the direction of the surface of the heat sink.

Part of the heat generated from the semiconductor body is diffused from the exposed surface of the semiconductor body to a peripheral portion, the rest being directed to the heat sink through the support. Since the exposed surface of the semiconductor body forms the angle of not more than 90° with the major surface of the heat sink, the heat diffused to the peripheral portion is caused to escape to the heat sink relatively rapidly. The heat transferred from the semiconductor body to the support, which is made of metal, is transferred directly to the heat sink rapidly. The semiconductor device of the present invention is excellent in heat sink property.

In particular, when the plurality of semiconductor bodies supported respectively with the plurality of supports are arranged such that the respective surfaces of the semiconductor bodies are not opposed to each other, the heat generated from the respective semiconductor bodies does not act synergistically. Thus, the semiconductor device having a particularly excellent durability is achieved.

The semiconductor body is supported with the metal support, so that heat is diffused rapidly.

In particular, the use of the metal block as the support provides for a large buffer effect in heat diffusion. The use of the metal plate as the support is advantageous for fabrication.

In the present invention, the term "metal" includes both simple substances and compounds of metal.

An object of the present invention is to reduce the size of a semiconductor device and to improve the durability thereof.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
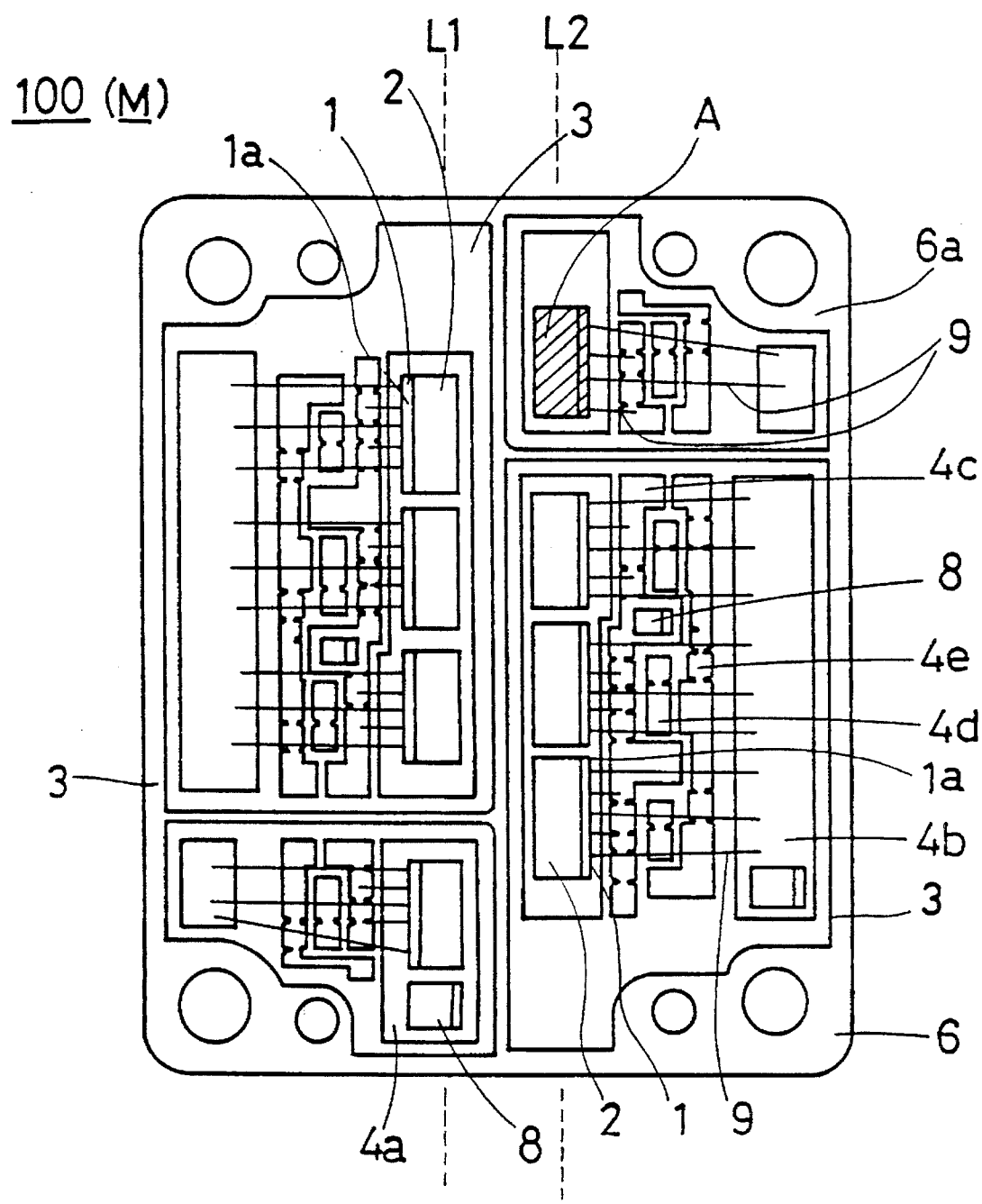
FIG. 1 is a plan view of a major part of a semiconductor device according to a first preferred embodiment of the present invention.
Figure 2:
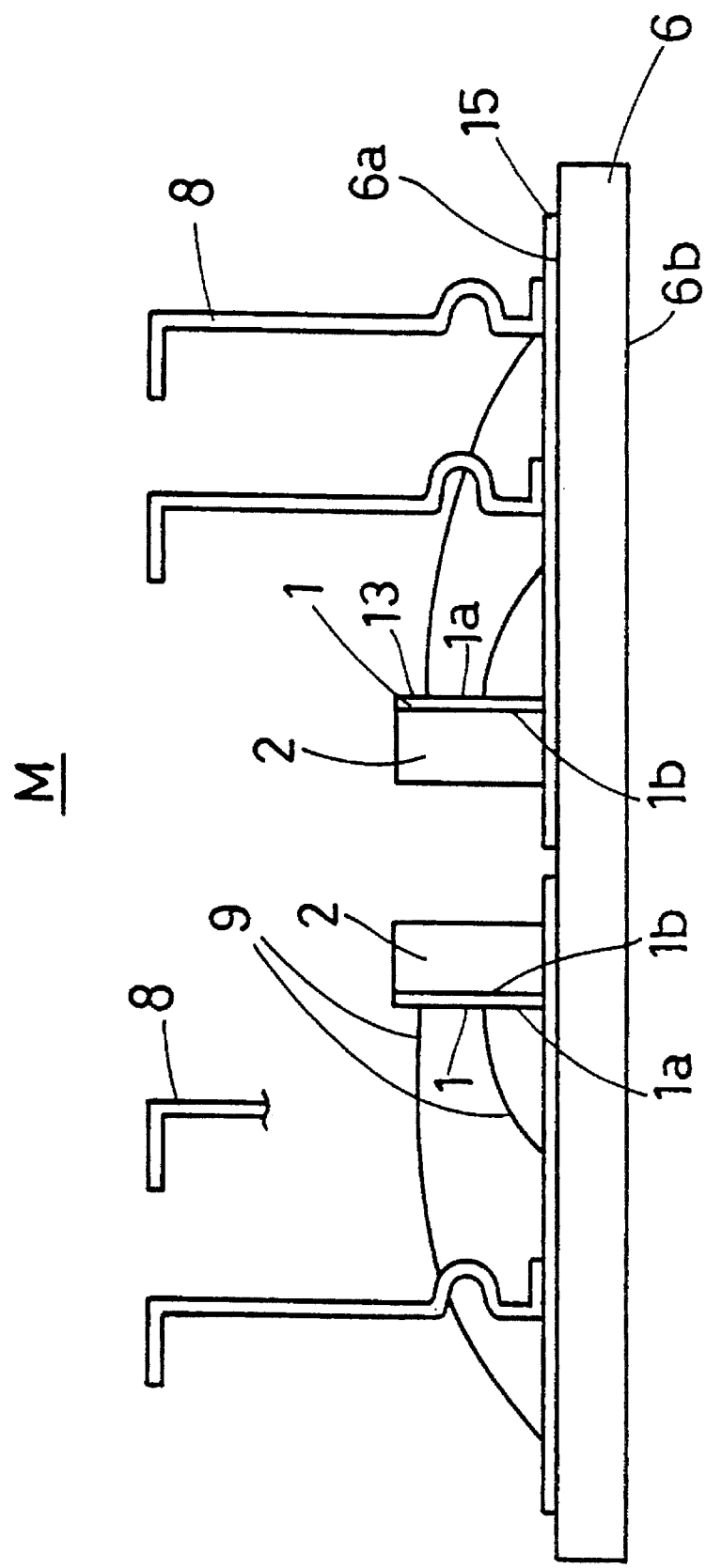
FIG. 2 is a schematic front elevation of the semiconductor device of FIG. 1.
Figure 3:
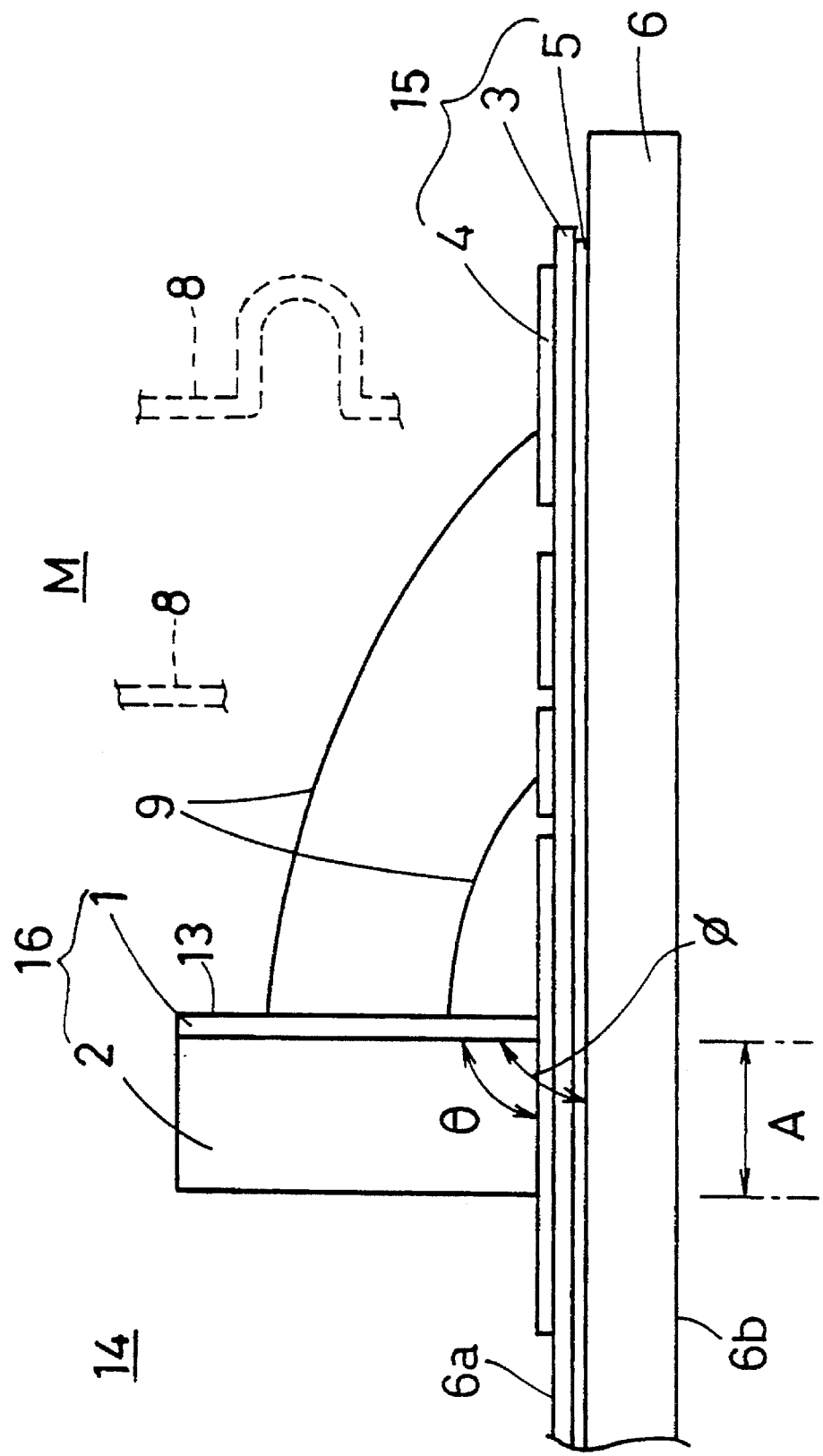
FIG. 3 is a partially enlarged view of the semiconductor device of FIG. 2.
Figure 4:
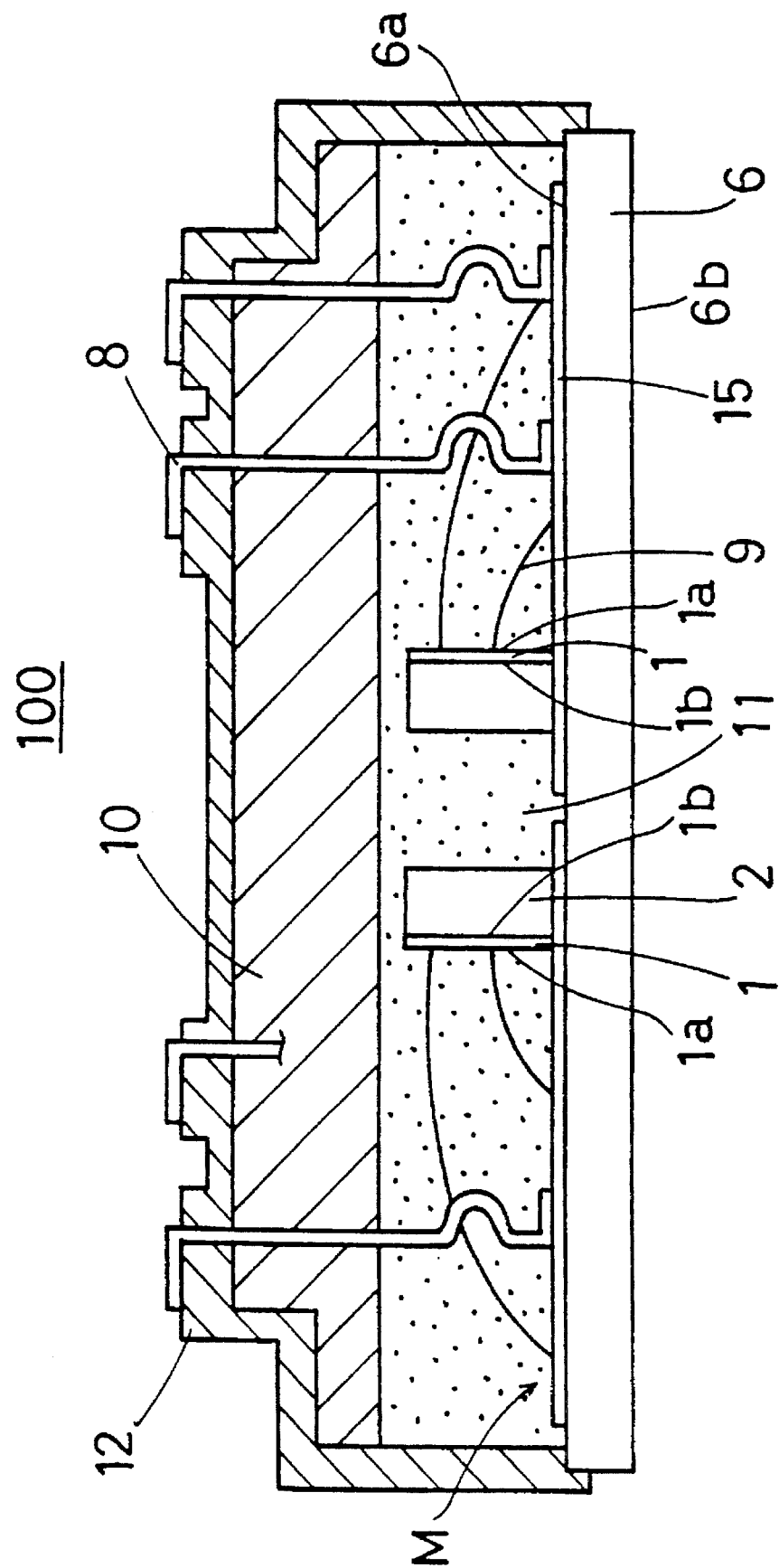
FIG. 4 is a front elevation of a resin seal of the semiconductor device of the first preferred embodiment.
Figure 15:
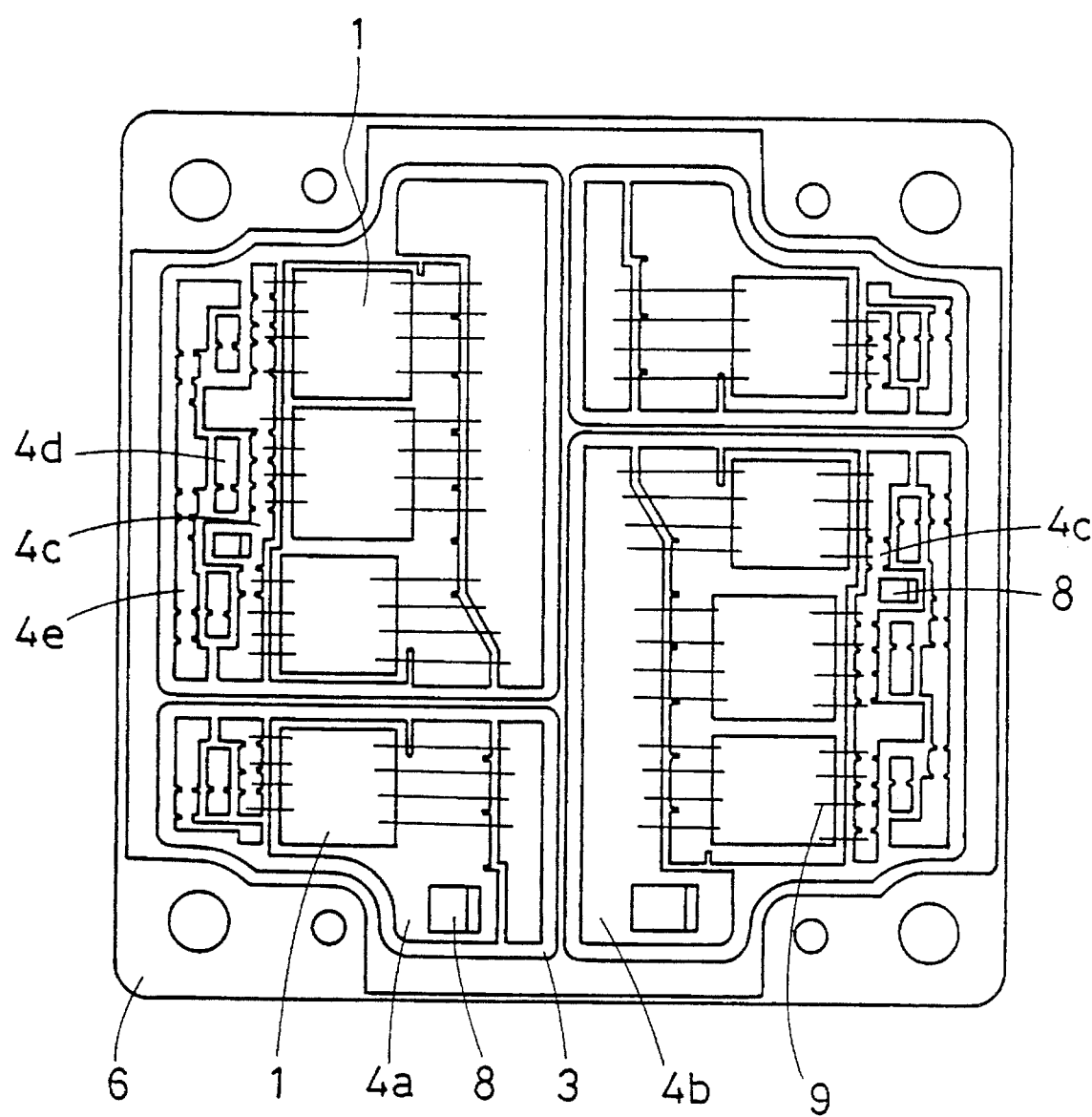
FIG. 15 is a plan view of a major part of a conventional semiconductor device.
Figure 16:
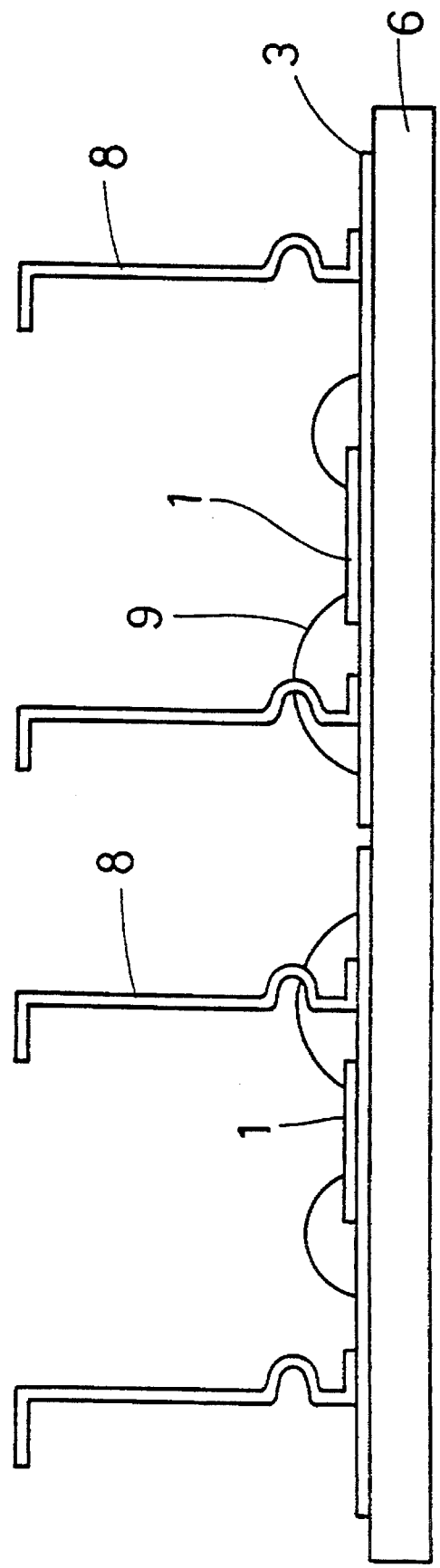
FIG. 16 is a schematic front elevation of the semiconductor device of FIG. 15.

Preferred embodiments of the present invention will be described hereinafter with reference to the drawings.
First Preferred Embodiment FIG. 1 is a plan view of a module M forming a major part of a semiconductor device 100 of a first preferred embodiment according to the present invention. FIG. 2 is a schematic front elevation of the module M as viewed in the direction of the arrow A2 of FIG. 1. FIG. 3 is a partially enlarged view of the module M of FIG. 2. FIG. 4 is a front elevation of the semiconductor device 100 that has been resin-sealed and covered with a resin case 12 as viewed in the same direction as FIG. 2. The semiconductor device 100 of FIG. 1 has the same capacity and is drawn on the same scale as the semiconductor device 200 of FIG. 15. The corresponding front elevations of FIGS. 2 and 16 are also drawn on the same scale.

The module (mount assembly) M is a power module including a plurality of transistors to be described later.

The module M comprises a heat sink 6 made of metal. The heat sink 6 has substantially parallel upper and lower major surfaces 6a and 6b. Mounting substrates (composite substrates) 15 are disposed on the upper major surface 6a. Each of the mounting substrates 15 includes an insulating substrate 3 shown in FIG. 3. The insulating substrate 3 has an upper major surface on which a metal pattern (wiring pattern) 4 is formed and a lower major surface on which a metal layer 5 is formed. The internal structure of the mounting substrates 15 is not shown in FIGS. 2 to 5. As shown in FIG. 1, the metal pattern 4 includes a plurality of patterns 4a to 4e. The metal patterns 4a, 4b, 4c serve as collector, emitter, base electrode patterns, respectively. The metal patterns 4d and 4e serve as relay electrode patterns.

A plurality of copper blocks 2 are arranged in two lines on the metal pattern 4a. Lines L1 and L2 are parallel to each other, and each of the lines L1 and L2 is comprised of four copper blocks 2. The lines L1 and L2 are located substantially centrally of the upper major surface 6a of the heat sink 6 in the lateral direction of
FIG. 1.

Each of the copper blocks 2 is of a rectangular parallelepipedic configuration, and six faces thereof are substantially parallel or perpendicular to the upper major surface 6a of the heat sink 6.

As shown in
FIG. 2, one major surface 1b of each semiconductor body 1 is soldered to one of the vertical faces of each copper block 2, and the other major surface 1a of each semiconductor body 1 is exposed. An angles $\phi$ between the respective major surfaces of the semiconductor bodies 1 and the upper major surface 6a of the heat sink 6 is substantially 90°. The upper major surface of the mounting substrates 15 is parallel to the upper major surface 6a of the heat sink 6. Thus the angle $\theta$ between the upper major surface of the mounting substrates 15 and the respective major surfaces of the semiconductor bodies 1 is also substantially 90°.

Referring again to FIG. 1, the semiconductor bodies 1 are attached to the left-hand side faces of the copper blocks 2 in the first line L1 and are attached to the right-hand side faces thereof in the second line L2. Accordingly the exposed surfaces 1a of the semiconductor bodies 1 in the first line L1 and in the second line L2 are not opposed to each other but are in back-to-back relation to each other. In each of the lines L1 and L2, the exposed surfaces 1a of the semiconductor bodies 1 are arranged in a line. Thus the exposed surfaces 1a of the semiconductor bodies 1 in each of the lines L1 and L2 are not opposed to each other.

In the module M of the first preferred embodiment, a transistor is incorporated in each of the semiconductor bodies 1. The collector of the transistor is connected to the copper block 2 on the bottom major surface 1b of the semiconductor body 1. The emitter and base of the transistor are selectively exposed on the top major surface 1a of the semiconductor body 1. Metal wires 9 are provided between the top major surface 1a of the semiconductor body 1 and the metal patterns 4b to 4e to electrically connect the emitter and base of the semiconductor body 1 to the metal patterns 4b to 4e.

Electrode terminals 8 are provided upright on the metal patterns 4a to 4d. The electrical connection of the semiconductor bodies 1 to the metal patterns 4a to 4d permits the electrical connection between the semiconductor bodies 1 and the electrode terminals 8. The module M is electrically operated by applying a main current and a control signal from the exterior through the electrodes 8.

Reference is made to FIG. 4. The module M having such structure is housed in a lower portion of the hollow, open-bottomed resin case 12. The lower inner space of the resin case 12 is filled with silicone gel 11, and the upper inner space of the resin case 12 is filled with epoxy resin 10. The silicone gel 11 covers part of the module M which includes the supports 2, the semiconductor bodies 1 and the wires 9. The upper portions of the electrode terminals 8 extend upwardly over the resin case 12.

In the semiconductor device 100, the respective semiconductor sides 1 are mounted vertically through the copper blocks 2. This reduces the mounting area A (indicated by the shaded portion of FIG. 1) of the semiconductor bodies 1 and the copper blocks 2 in the direction parallel to the major surface 6a of the heat sink 6 as compared with the area of the horizontally mounted semiconductor bodies 1 of the prior art. Since the copper blocks 2 are a good heat conductor, the capability to make the heat generated from the semiconductor bodies 1 escape to the heat sink 6 is not decreased when the bottom area of the copper blocks 2 is smaller than the area of the major surfaces 1a, 1b of the semiconductor bodies 1. This enables reduction in area A for mounting the individual semiconductor bodies 1 and accordingly reduction in horizontal size of the semiconductor device 100.

The heat generated from the semiconductor bodies 1 and dissipated from the bottom major surfaces 1a of the semiconductor bodies 1 is rapidly diffused through the copper blocks 2 having excellent heat conductivity to the heat sink 6. Such heat does not affect other semiconductor bodies 1.

The heat dissipated from the exposed major surfaces 1a of the semiconductor bodies 1 is transferred to the silicone gel 11 of FIG. 4. The heat sink 6 is laid adjacent the transfer path of heat through the mounting substrates 15. Thus the heat dissipated from the major surface 1a is also diffused to the heat sink 6 more rapidly than the heat in the prior art and is less apt to be held in the semiconductor device 100.

This reduces the heat interference between the semiconductor bodies 1, so that the semiconductor bodies I are less apt to be thermally broken.

Particularly in the semiconductor device 100 of the first preferred embodiment, since the exposed surfaces 1a of the respective semiconductor bodies 1 are arranged so as not to be opposed to each other, the heat dissipated from the exposed surface 1a of one semiconductor body 1 interferes with the other semiconductor bodies 1 more effectively.

The fabrication of the semiconductor device 100 will be described hereinafter. The heat sink 6, the substrates 15 including the insulating substrates 3 provided with the metal patterns 4 and metal layers 5, and combinations 16 of the copper blocks 2 and semiconductor bodies 1 are soldered together such that the angle between one surface of the semiconductor bodies 1 and one surface of the heat sink 6 is substantially 90° as shown in FIG. 3. The copper blocks 2 are previously bonded by soldering to the semiconductor bodies 1, respectively. The combinations 16 are connected to the metal pattern 4a, so that the electrode 4a is provided. Then the semiconductor bodies 1 are connected to the metal patterns 4b, 4c with the wires 9 such as aluminum bonding wire, so that the electrodes 4b, 4c are provided. The external electrodes 8 are soldered to the electrodes 4a, 4b, 4c. The resin case 12 as shown in FIG. 4 is put on a provided mount assembly 14. The silicone gel 11 is injected from an opening not shown into the resin case 12 to a depth which permits the semiconductor bodies 1 and the wires 9 to be buried and is then made to thermoset. The inner space of the case 12 is further filled with the epoxy resin 10, which is then made to thermoset.

Figure 5:
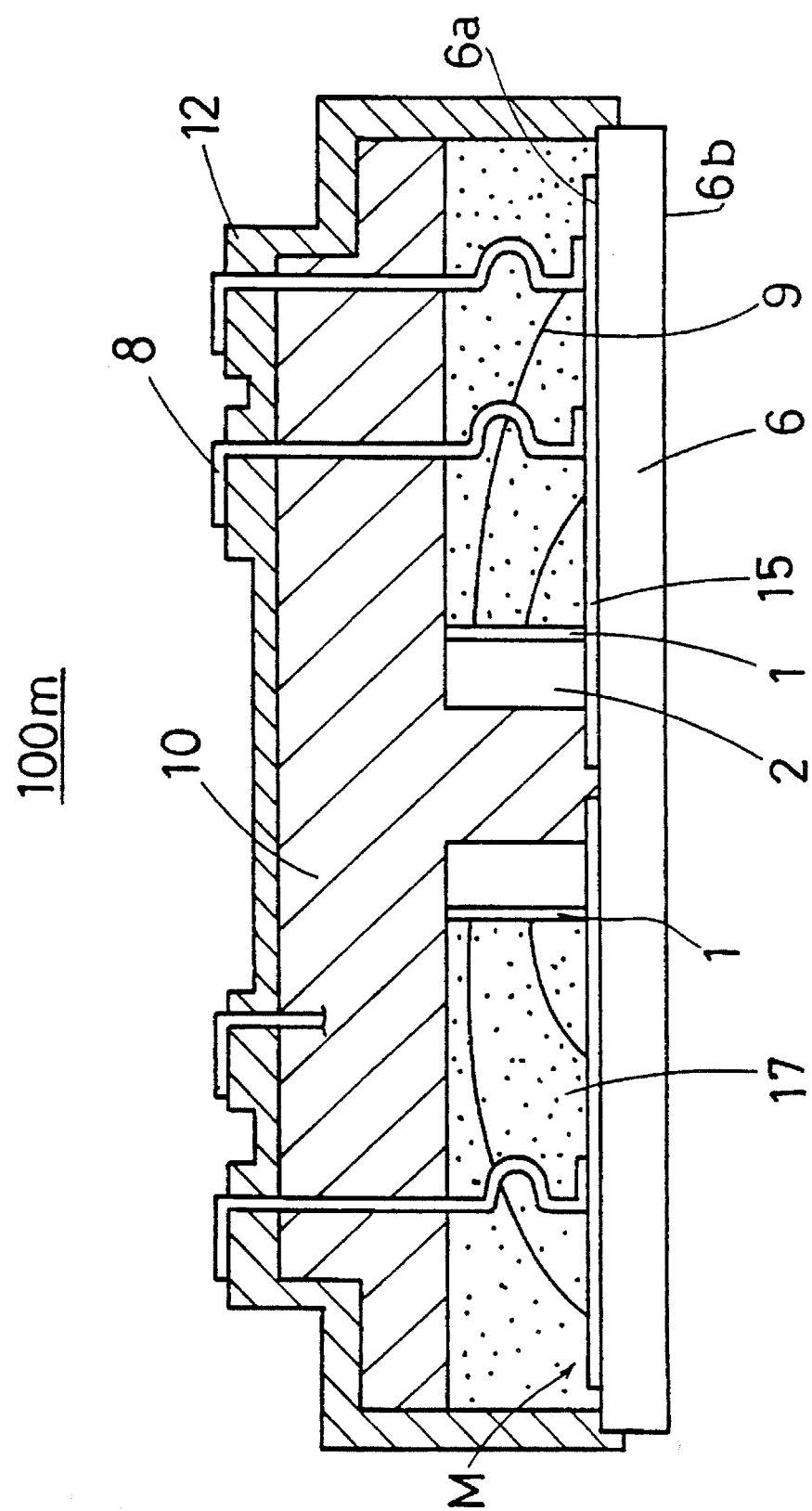
FIG. 5 is a front elevation of another resin seal of the semiconductor device of the first preferred embodiment.

FIG. 5 shows a variation of the semiconductor device 100 of FIG. 4. A semiconductor device 100 m differs from the semiconductor device 100 of FIG. 4 in sealing mode of the module M. The other structure of the semiconductor device 100m is identical with that of the semiconductor device 100. In the semiconductor device 100m, a gelatinous material (junction coat) 17 may be applied only to a portion including the junction, the other portion than the gelatinous material in the case 12 being filled with the epoxy resin 10.

Second Preferred Embodiment

Figure 6:
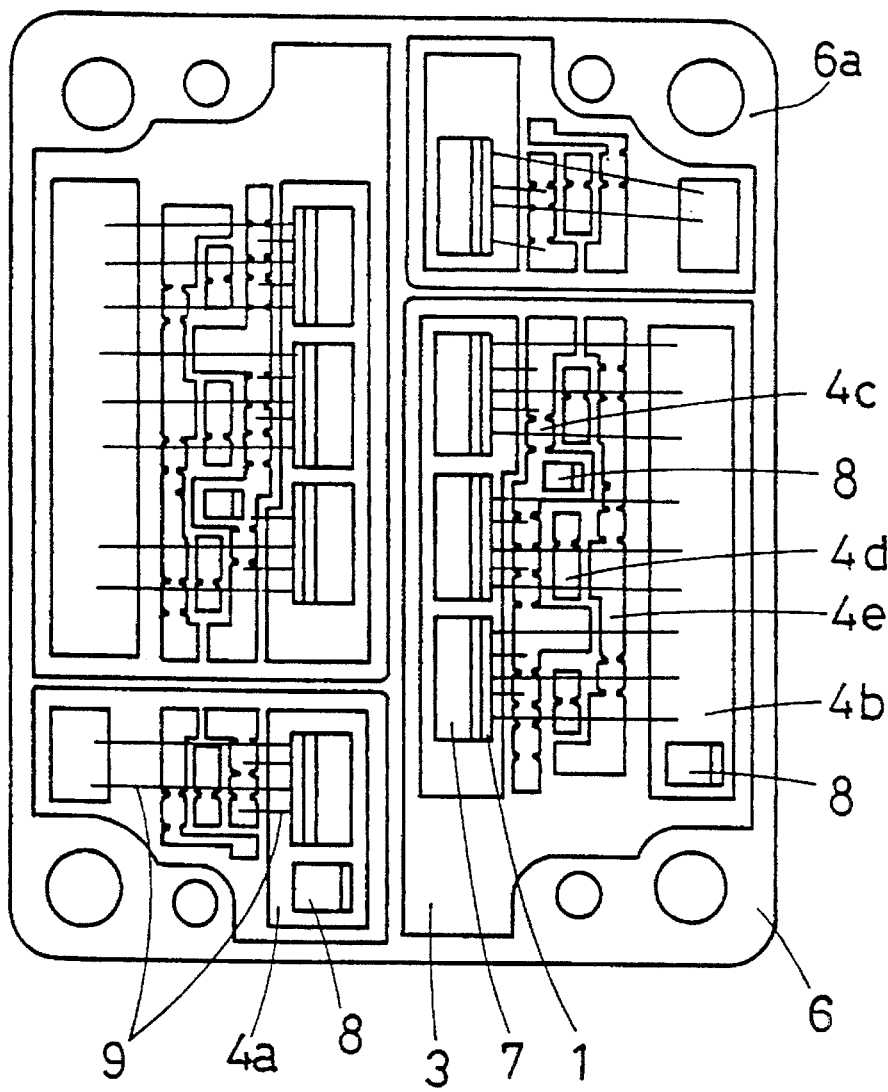
FIG. 6 is a plan view of a major part of a semiconductor device according to a second preferred embodiment of the present invention.
Figure 7:
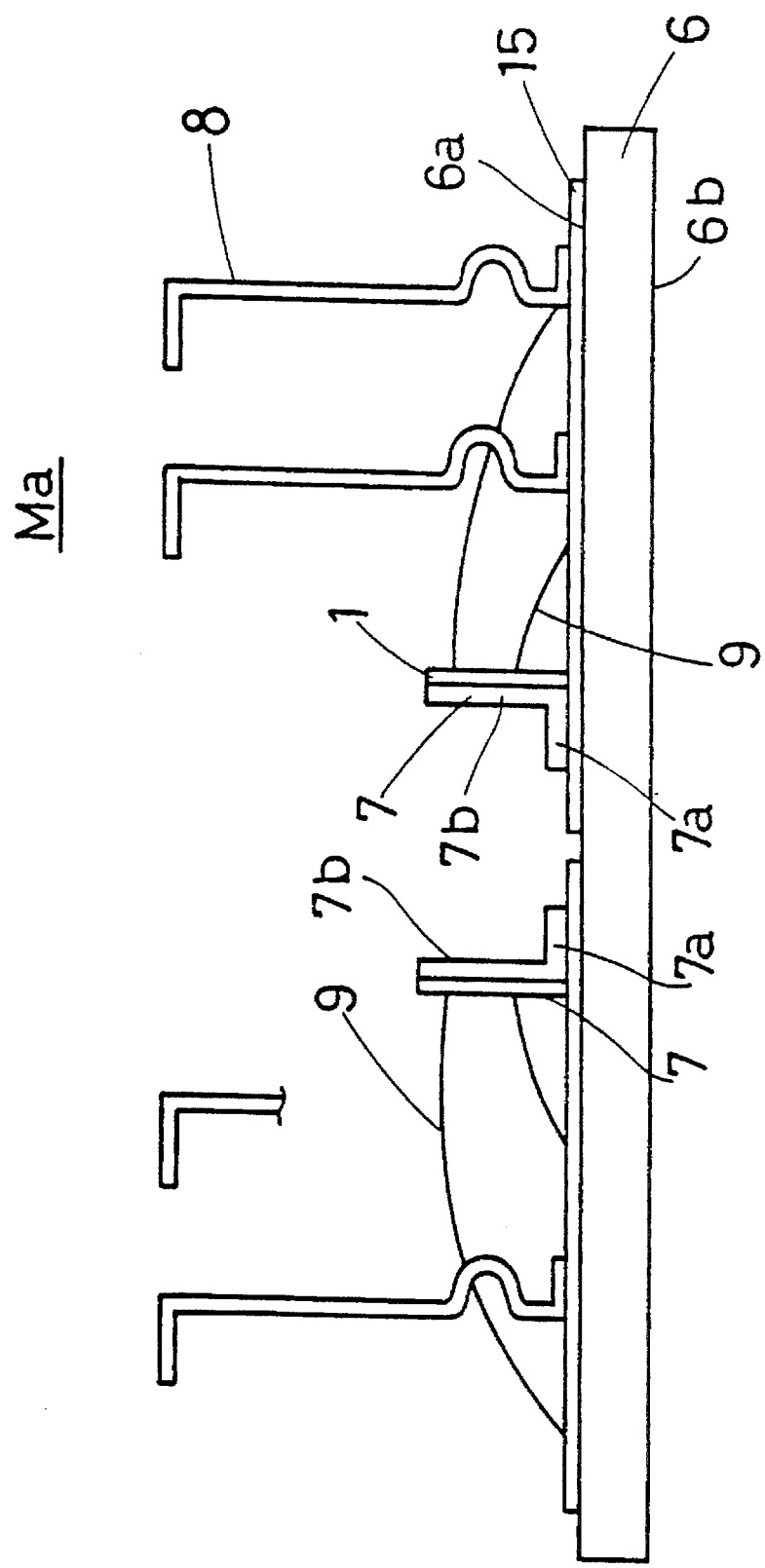
FIG. 7 is a schematic front elevation of the semiconductor device of FIG. 6.
Figure 8:
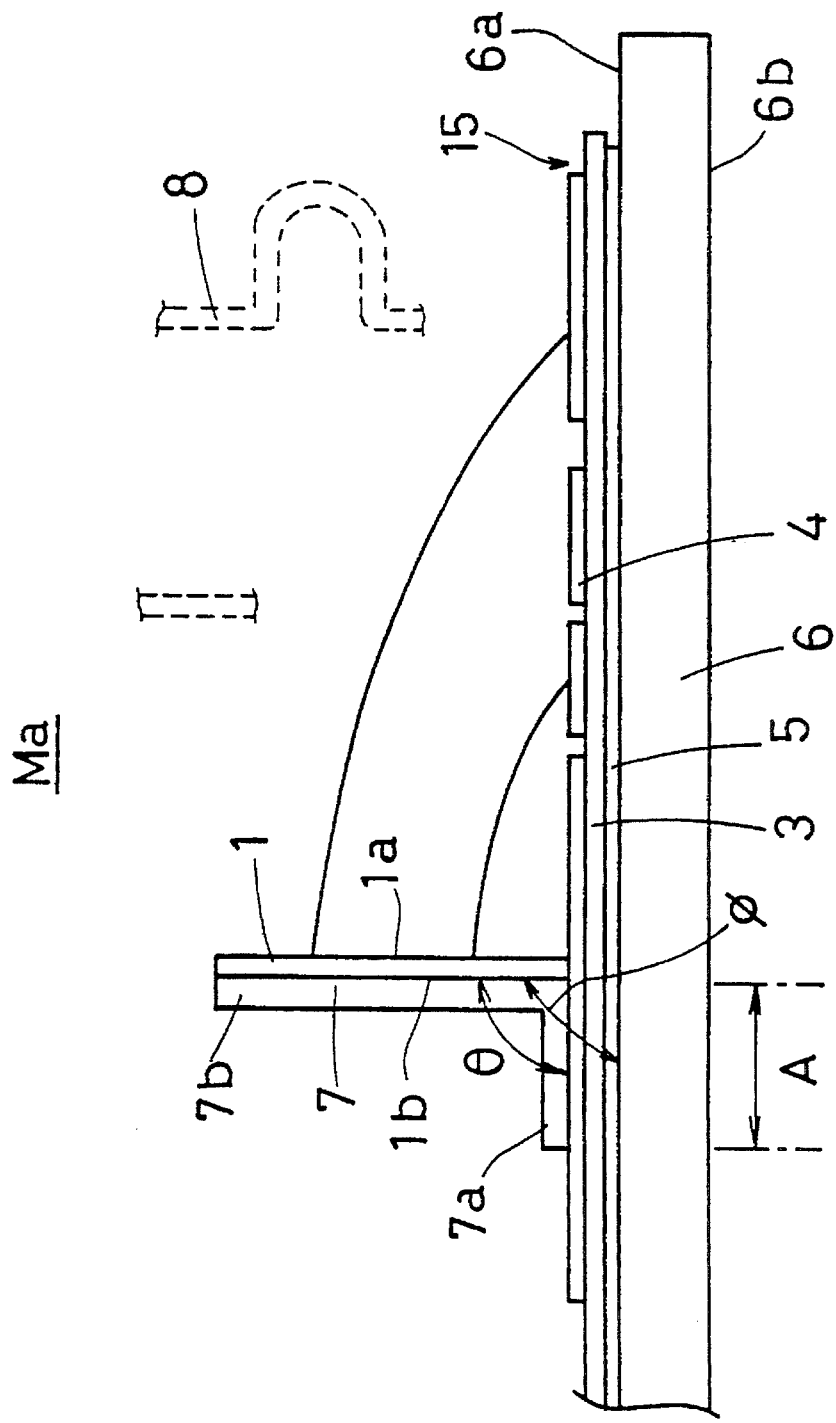
FIG. 8 is a partially enlarged view of the semiconductor device of FIG. 7.

FIGS. 6, 7 and 8 show a semiconductor device 10a according to a second preferred embodiment of the present invention. FIG. 6 is a plan view of a module Ma forming a major part of the semiconductor device 100a. FIG. 7 is a schematic front elevation of the module Ma as viewed in the direction of the arrow A3 of FIG. 6. FIG. 8 is a partially enlarged view of the module Ma of FIG. 7. The semiconductor device 100a of FIG. 6 has the same capacity as the semiconductor device 100 of FIG. 1. FIGS. 6, 7 and 8 are drawn on the same scale as FIGS. 1, 2 and 3, respectively. Like reference numerals and characters are used in FIGS. 6, 7 and 8 to designate parts identical with those of FIGS. 1, 2 and 3. In the second preferred embodiment, copper plates 7 bent at right angles are employed in place of the copper blocks 2. The angle $\phi(=\Theta)$ between the respective major surfaces 1a, 1b of the semiconductor body 1 and the major surface 6a of the heat sink 6 is substantially 90°. As shown in FIG. 7, each of the copper plates 7 of an L-shaped cross-sectional configuration includes a first plate portion 7a fixed on the substrate 15 and a second plate portion 7b extending from the first plate portion 7a substantially perpendicularly thereto. The semiconductor bodies 1 are mounted on one major surface of the copper plates 7 on the opposite side from the first plate portions 7a.

The module Ma is housed in the resin case and is resin-sealed in the same fashion as the module M of FIGS. 4 and 5. (The same is true for other preferred embodiments to be described later.)

The semiconductor device 100a is fabricated by the same method as the semiconductor device 100 of the first preferred embodiment.

The second preferred embodiment provides the heat sink effect, the mounting area reduction effect and the heat interference preventing effect for the same reason as the first preferred embodiment.

Third Preferred Embodiment

Figure 9:
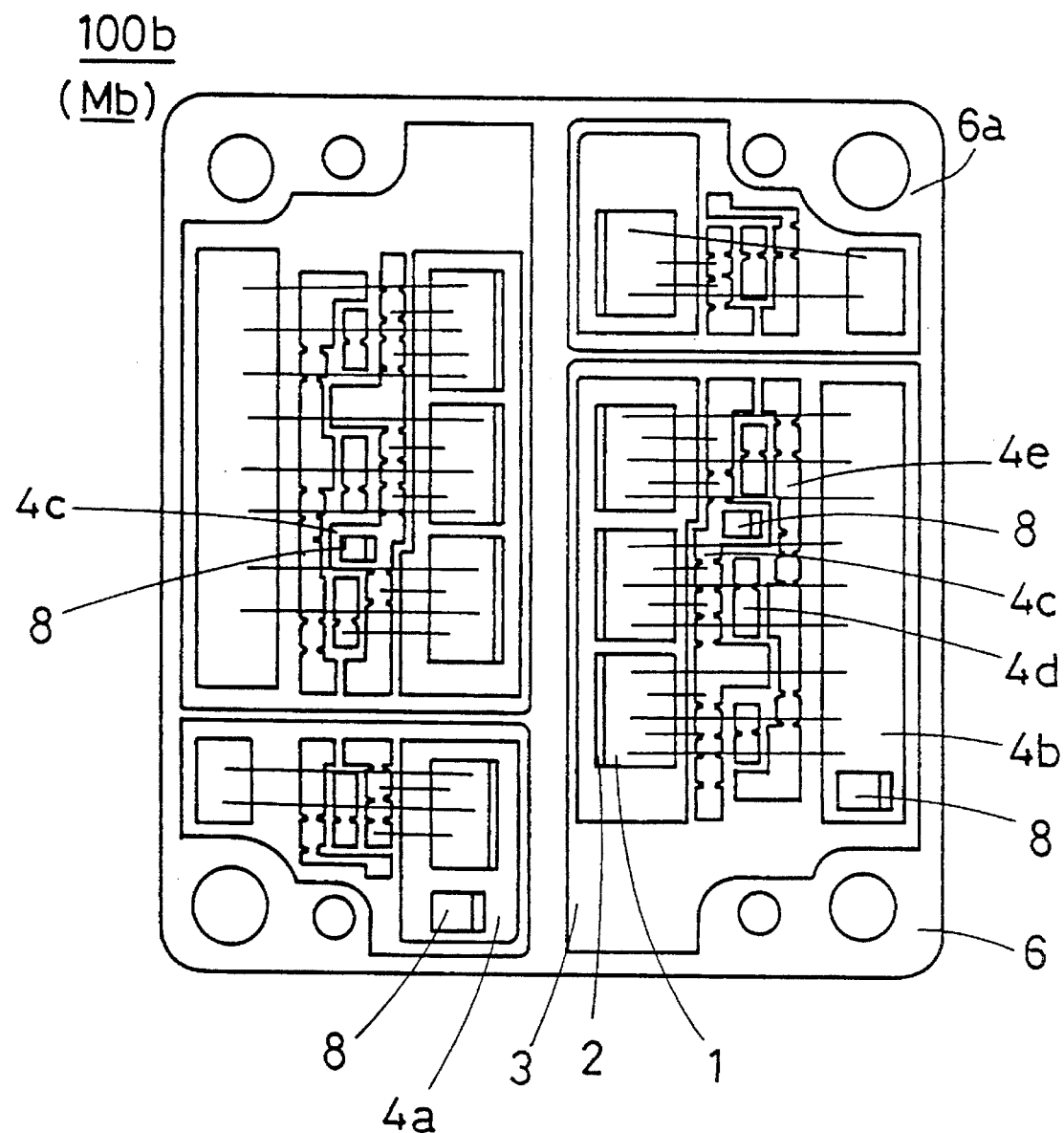
FIG. 9 is a plan view of a major part of a semiconductor device according to a third preferred embodiment of the present invention.
Figure 10:
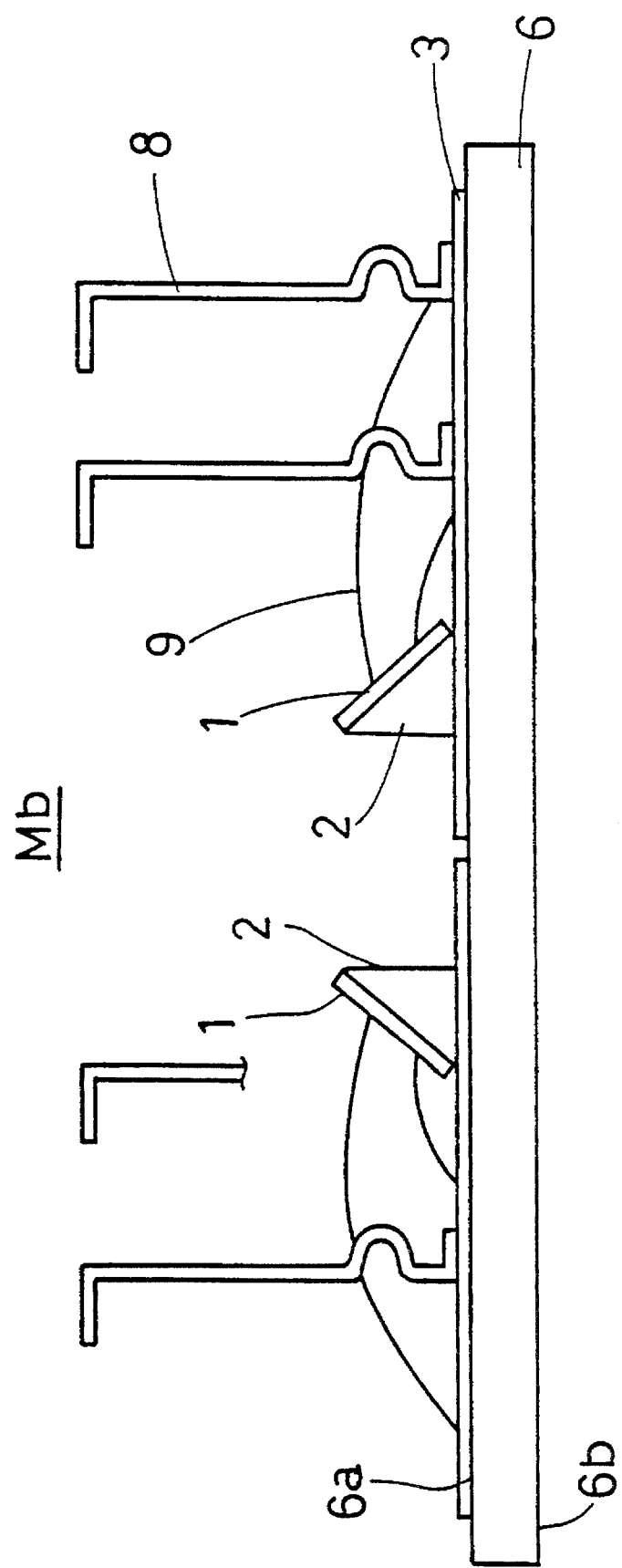
FIG. 10 is a schematic front elevation of the semiconductor device of FIG. 9.
Figure 11:
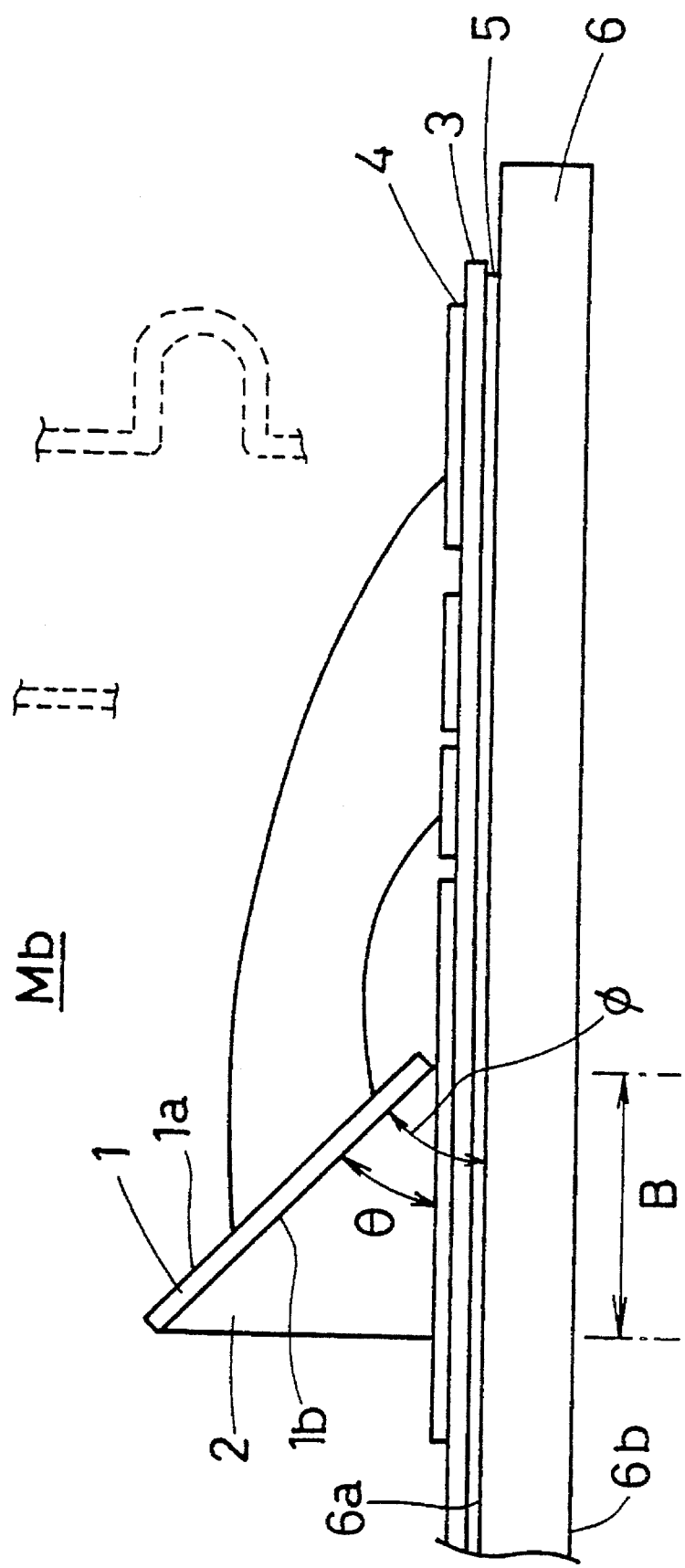
FIG. 11 is partially enlarged view of the semiconductor device of FIG. 10.

FIGS. 9, 10 and 11 show a semiconductor device 100b according to a third preferred embodiment of the present invention. FIG. 9 is a plan view of a module Mb forming a major part of the semiconductor device 100b. FIG. 10 is a schematic front elevation of the semiconductor device 100b as viewed in the direction of the arrow A4 of FIG. 9. FIG. 11 is a partially enlarged view of the semiconductor device 100b of FIG. 10. The semiconductor device 100b of FIG. 9 has the same capacity as the semiconductor device 100 of FIG. 1. FIGS. 9, 10 and 11 are drawn on the same scale as FIGS. 1, 2 and 3, respectively. Like reference numerals and characters are used in FIGS. 9, 10 and 11 to designate parts identical with those of FIGS. 1, 2 and 3. The module Mb of the third preferred embodiment includes the copper blocks 2 of a triangular cross-sectional configuration, which are different from those of the first preferred embodiment. The angle $\phi(=\Theta)$ between the respective major surfaces $1a$, $1b$ of the semiconductor bodies 1 and the major surface $6a$ of the heat sink 6 is more than 0° and less than 90°. That is, the angle $\phi$ is acute, preferably in the range of 35° to 45°.

The semiconductor device $100b$ is fabricated by the same method as the semiconductor device 100 of the first preferred embodiment.

The third preferred embodiment provides the heat sink effect, the mounting area reduction effect and the heat interference preventing effect for the same reason as the first preferred embodiment.

It may be evident from the comparison between FIGS. 3 and 11 that the contact area between the block 2 and the substrate 15 in the third preferred embodiment is larger than that of the semiconductor device 100 of the first preferred embodiment (i.e., the width A is greater than the width B). The heat sink capability to the heat sink 6 of the third preferred embodiment is larger than that of the first preferred embodiment. The semiconductor device $100b$ is suitable for the large-capacity semiconductor device and IGBT including the semiconductor bodies 1 which generates a large amount of heat.

Fourth Preferred Embodiment

Figure 12:
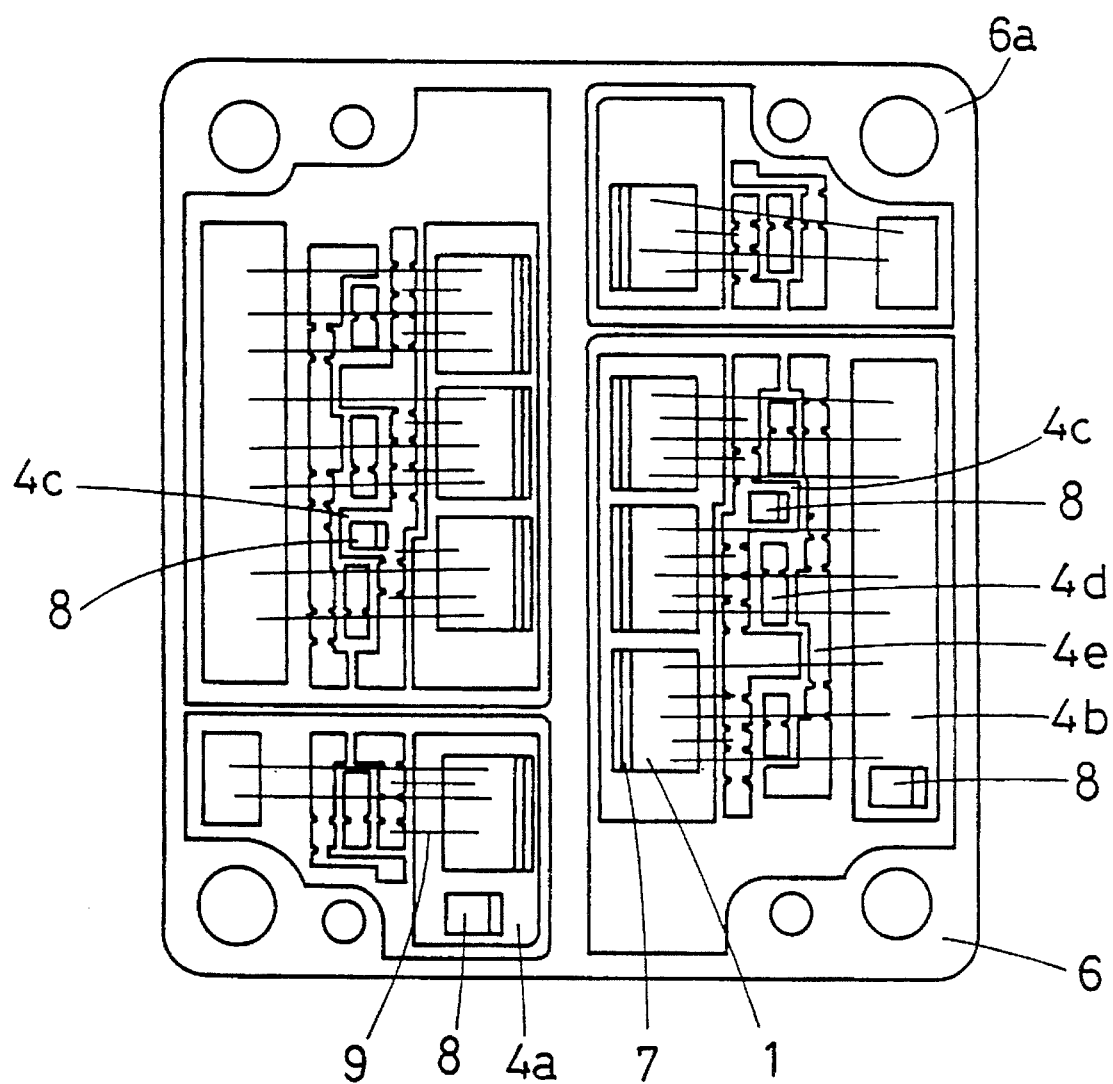
FIG. 12 is a plan view of a major part of a semiconductor device according to a fourth preferred embodiment of the present invention.
Figure 13:
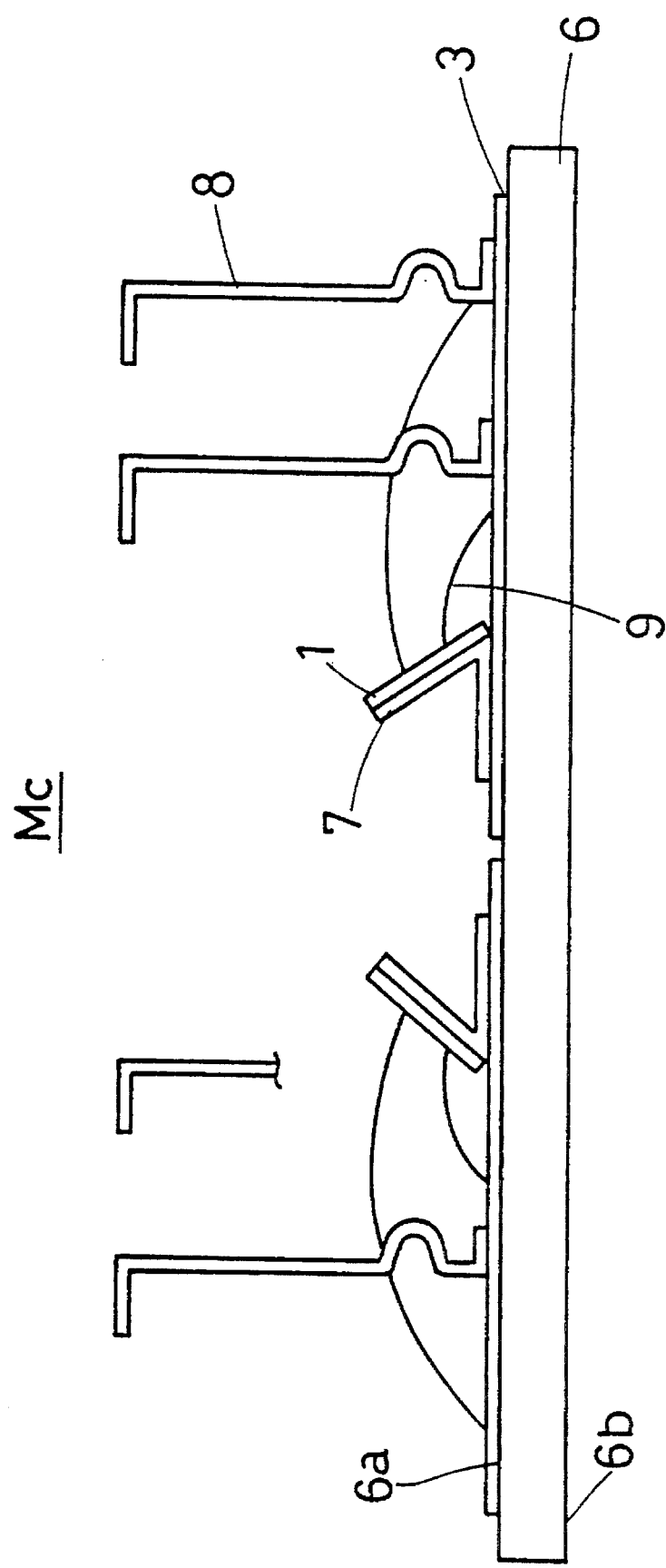
FIG. 13 is a schematic front elevation of the semiconductor device of FIG. 12.
Figure 14:
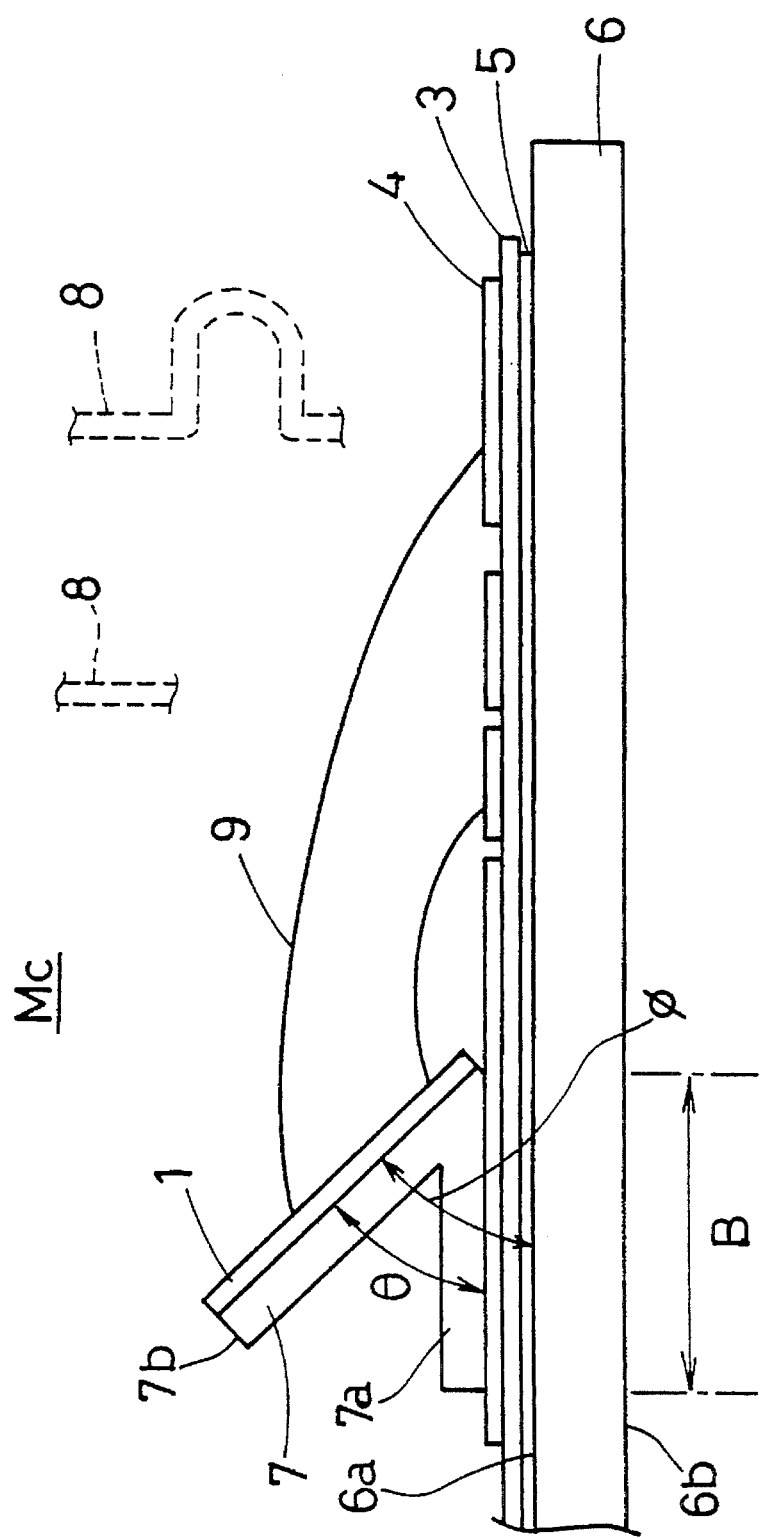
FIG. 14 is a partially enlarged view of the semiconductor device of FIG. 13.

FIGS. 12, 13 and 14 show a semiconductor device $100c$ according to a fourth preferred embodiment of the present invention. FIG. 12 is a plan view of a module Mc forming a major part of the semiconductor device $100c$. FIG. 13 is a schematic front elevation of the semiconductor device $100c$ as viewed in the direction of the arrow A5 of FIG. 12. FIG. 14 is a partially enlarged view of the semiconductor device $100c$ of FIG. 13. The semiconductor device $100c$ of FIG. 12 has the same capacity as the semiconductor device 100 of FIG. 1. FIGS. 12, 13 and 14 are drawn on the same scale as FIGS. 1, 2 and 3, respectively. Like reference numerals and characters are used in FIGS. 12, 13 and 14 to designate parts identical with those of FIGS. 1, 2 and 3.

In the fourth preferred embodiment, the copper plates 7 bent at acute angles are employed in place of the copper blocks 2. The angle $\phi$ $(=\Theta)$ between the respective major surfaces $1a$, $1b$ of the semiconductor bodies 1 and the major surface $6a$ of the heat sink 6 is more than 0° and less than 90°, preferably in the range of 35° to 45°.

The semiconductor device $100c$ is fabricated by the same method as the semiconductor device 100 of the first preferred embodiment.

The fourth preferred embodiment provides the heat sink effect, the mounting area reduction effect and the heat interference preventing effect for the same reason as the first preferred embodiment.

For the same reason as the third preferred embodiment, the semiconductor device $100c$ of the fourth preferred embodiment has a larger heat diffusing capability than the semiconductor device $100a$ of the second preferred embodiment.

In the first to fourth preferred embodiments, the metal blocks and plates used for supporting the semiconductor bodies 1 have respectively characteristic advantages. The metal plates are advantageous in that they require a small amount of material. Furthermore, the metal plates are mass-produced by means of a press and are worked with case, providing cost reduction. Another advantage of the metal plates is their light weight.

The metal blocks have a larger volume than the metal plates of the same size and, accordingly, have a large thermal capacity, so that buffer effect is expected for heat diffusion. There is no possibility of deformation of the metal blocks while being mounted on the substrates 15.

In the first to fourth preferred embodiments, the supports and the semiconductor bodies are previously joined together. However, the supports and the semiconductor bodies may be soldered together simultaneously with the soldering of the heat sink, the mounting substrates and the supports. The supports may be bonded to the insulating substrates.

Although the copper blocks and copper plates are used as supports, the supporting material may be made of other metals having an excellent thermal conductivity or compounds of metal such as alumina and aluminum nitride. When the supporting material is an insulator such as oxide or nitride, the supports may be bonded to the metal patterns or insulating substrates with adhesives, and adhesives may be used for bonding between the semiconductor bodies and the supports. In these cases, the collector of the semiconductor bodies 1 is connected to the metal pattern $4a$ with a wire.

A possible technique is to support the semiconductor bodies at obtuse angles with respect to the heat sink. In this technique, however, an additional space for the supporting plates is required in the direction parallel to the major surface of the heat sink, preventing increase in packaging density. This technique finds difficulty in the succeeding process steps such as wire bonding to the semiconductor as compared with the present invention, so that the effects of the present invention are not expected from the technique.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:

(a) a heat sink having a major surface;

(b) a mounting substrate fixed on said heat sink and including (b-1) an insulating layer provided on said major surface of said heat sink, and (b-2) a pattern electrode layer selectively formed on said insulating layer;

(c) a metal support formed on said mounting substrate and having a surface forming an angle of substantially not more than 90° with said major surface of said heat sink; and (d) a semiconductor body soldered on said surface of said support to thereby be supported with said support.

2. The semiconductor device of claim 1, wherein said semiconductor body includes:

(d-1) a first major surface fixed on said surface of said support; and (d-2) a second major surface substantially parallel to said first major surface, said semiconductor device further comprising:

(e) a wire provided between said second major surface and said pattern electrode layer.

3. The semiconductor device of claim 2, further comprising:

(f) an open-bottomed case fixed on said heat sink for enclosing a space housing said components (b) to (e); and (g) a gelatinous material filling at least a part of said space which encloses said wire.

4. The semiconductor device of claim 3, wherein said support includes:
   (c-1) a metal block.

5. The semiconductor device of claim 4, wherein said metal block includes:
   (c-1-1) a first flat surface substantially parallel to said major surface of said heat sink; and
   (c-1-2) a second flat surface substantially perpendicular to said first flat surface,
said second flat surface being equivalent to said surface of said support.

6. The semiconductor device of claim 4, wherein said metal block includes:
   (c-1-3) a first flat surface substantially parallel to said major surface of said heat sink; and
   (c-1-4) a second flat surface forming an acute angle with said first flat surface,
said second flat surface being equivalent to said surface of said support.

7. The semiconductor device of claim 6, wherein said acute angle is selected from angles ranging from 35° to 45°.

8. The semiconductor device of claim 3, wherein said support includes:
   (c-2) a bent metal member.

9. The semiconductor device of claim 8, wherein said metal member includes:
   (c-2-1) a first plate portion substantially parallel to said major surface of said heat sink; and
   (c-2-2) a second plate portion substantially perpendicular to said first plate portion,
the surface of said second plate portion being equivalent to said surface of said support.

10. The semiconductor device of claim 8, wherein said metal member includes:
    (c-2-3) a first plate portion substantially parallel to said major surface of said heat sink; and
    (c-2-4) a second plate portion forming an acute angle with said first plate portion,
the surface of said second plate portion being equivalent to said surface of said support.

11. The semiconductor device of claim 10, wherein said acute angle is selected from angles ranging from 35° to 45°.

12. The semiconductor device of claim 3, wherein said insulating layer a top surface and a bottom surface, and
said pattern electrode layer is provided on said top surface of said insulating layer,
said mounting substrate further including:

(b-3) a metal layer joined to said bottom surface of said insulating layer.

13. A semiconductor device comprising:
    (a) a heat sink having a major surface;
    (b) a metal block fixed on and electrically insulated from said heat sink and having a surface forming an angle of substantially not more than 90° with said major surface of said heat sink; and
    (c) a semiconductor body soldered on said surface of said block to thereby be supported with said block.

14. A semiconductor device comprising:
    (a) a heat sink having a major surface;
    (b) a metal support member including a first plate portion fixed on and electrically insulated from said heat sink, and a second plate portion extending in a direction that forms an angle of substantially not more than 90° with said major surface of said heat sink from an end of said first plate portion; and
    (c) a semiconductor body soldered on a surface of said second plate portion to thereby be supported with said support member.

15. A semiconductor apparatus comprising:
    (a) a heat sink having a major surface;
    (b) a mounting substrate fixed on said major surface of said heat sink and including
        (b-1) an insulating layer provided on said major surface of said heat sink, and
        (b-2) a pattern electrode layer selectively formed on said insulating layer;
    (c) a plurality of metal supports each having a support surface forming an angle of substantially not more than 90° with said major surface of said heat sink and mounted on said mounting substrate;
    (d) a plurality of semiconductor bodies soldered on each said support surface of said supports to thereby be supported with said supports, respectively;
wherein, no said first surfaces face each other.

16. The semiconductor apparatus of claim 15, wherein: each of said metal supports support only one semiconductor body.

17. The semiconductor apparatus of claim 16, further comprising:
    a first row of said metal supports;
    a second row of said metal supports being substantially parallel to said first row of metal supports; and
    wherein, non-supporting surfaces on an opposite side to said support surface of said metal supports of said first row face non-supporting surfaces on an opposite side to said support surface of said metal supports of said second row.

* * * * *